(12) United States Patent
Barth (10) Patent No.: US 8,269,341 B2
(45) Date of Patent: Sep. 18, 2012

(54) COOLING STRUCTURES AND METHODS

(75) Inventor: Hans-Joachim Barth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 733 days.

(21) Appl. No.: 12/275,731

(22) Filed: Nov. 21, 2008

(65) Prior Publication Data

US 2010/0127390 A1 May 27, 2010

(51) Int. Cl.
*H01L 23/34* (2006.01)

(52) U.S. Cl. . 257/714; 257/721; 257/777; 257/E23.098; 257/E23.099; 438/122; 438/109

(58) Field of Classification Search .......... 257/714, 257/686, 777, E25.006, E25.013, E25.017, 257/E25.021, E25.027, E23.085, E25.018, 257/E25.023; 438/109, FOR. 368, FOR. 426
See application file for complete search history.

(56) References Cited

U.S. PATENT DOCUMENTS

| | | | |
|---|---|---|---|
| 5,199,165 A * | 4/1993 | Crawford et al. | 29/846 |
| 5,286,671 A | 2/1994 | Kurtz et al. | |
| 6,242,778 B1 | 6/2001 | Marmillion et al. | |
| 7,139,172 B2 | 11/2006 | Bezama et al. | |
| 7,153,757 B2 | 12/2006 | McCann et al. | |
| 7,342,309 B2 * | 3/2008 | Yoshida | 257/723 |
| 7,344,957 B2 | 3/2008 | Barna | |
| 7,355,277 B2 * | 4/2008 | Myers et al. | 257/712 |
| 7,727,807 B2 | 6/2010 | Han | |
| 7,882,624 B2 * | 2/2011 | Hu et al. | 29/832 |
| 2003/0139843 A1 | 7/2003 | Hu et al. | |
| 2005/0085018 A1 | 4/2005 | Kim et al. | |
| 2006/0002088 A1 | 1/2006 | Bezama et al. | |
| 2006/0145356 A1 * | 7/2006 | Liu et al. | 257/777 |
| 2007/0210446 A1 | 9/2007 | Andry et al. | |
| 2007/0267738 A1 | 11/2007 | Chung et al. | |
| 2009/0072382 A1 * | 3/2009 | Guzek | 257/712 |

FOREIGN PATENT DOCUMENTS

| | | |
|---|---|---|
| DE | 103 93 583 T5 | 2/2006 |
| DE | 10 2007 036 268 A1 | 2/2008 |

OTHER PUBLICATIONS

Tuckerman, D.B., et al., "High-Performance Heat Sinking for VLSI," IEEE Electron Device Letters, May 1981, pp. 126-129, vol. EDL-2, No. 5, Stanford, California.
Peters, Laura, "Wafer Bonding Enables New Technologies and Applications," Semiconductor International, Issue 12, Nov. 1, 2003, 5 pages, retrieved from http://www.semiconductor.net/article/CA331034.html.
Dang, Bing, et al., "Wafer-Level Microfluidic Coiling Interconnects for GSI," Proceedings IITC, 2005, 3 pages, Atlanta, Georgia.
Yoshimi, Makoto, et al., "Current Status and Future Perspectives of Wafer Bonding (Smart Cut™) SOI Technology," Process Gases, Chemicals and Materials, Section 7, 2007, 3 pages, vol. 20.

* cited by examiner

*Primary Examiner* — Jasmine Clark
(74) *Attorney, Agent, or Firm* — Slater & Matsil, L.L.P.

(57) ABSTRACT

Cooling structures and methods, methods of manufacturing semiconductor devices, and semiconductor devices are disclosed. In one embodiment, a cooling structure for a semiconductor device includes at least one channel defined between a first workpiece and a second workpiece. The second workpiece is bonded to the first workpiece. The at least one channel is adapted to retain a fluid.

43 Claims, 10 Drawing Sheets

COOLING STRUCTURES AND METHODS

TECHNICAL FIELD

The present invention relates generally to the fabrication of semiconductor devices, and more particularly to cooling structures and methods for semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing several insulating or dielectric layers, conductive layers, and semiconductive layers of material over a semiconductor substrate, and patterning the various layers using lithography to form circuit components and elements thereon.

There is a trend in the semiconductor industry towards reducing the size of features, e.g., the circuits, elements, conductive lines, vias, and contacts of semiconductor devices, in order to improve the performance of the semiconductor devices, reduce power consumption, and meet smaller packaging requirements, for example. However, as feature sizes and packaging of semiconductor devices are reduced, overheating can become a problem, which may deleteriously affect device performance and cause device failures.

Heatsink structures may be attached to packaging for heat dissipation of integrated circuits. Another approach is to form micro-channels or grooves onto a back side of an integrated circuit, after processing the front side of the integrated circuit. One approach is to form the micro-channels and cover them by a Pyrex™ by Corning Glass Works cover plate. Another approach is to fill the micro-channels with a decomposable polymer, cover the polymer with a first permeable overcoat, and after decomposing the polymer, form a second non-permeable overcoat over the first permeable overcoat.

However, the second micro-channel approach requires a complex manufacturing process flow. Furthermore, known micro-channel approaches are required to be performed after front side wafer processing and with a standard wafer thickness, because of warping of thinned wafers and handling difficulties. Die yields can be reduced, and there are limits on temperature budgets, due to the finalized front side processing. There are also limits in applications requiring extremely thinned dies, such as in 3D integrated circuit stacking. A significant spatial distance from active devices is also required, because of etch non-uniformities during micro-channel or groove etching into the silicon substrate from the wafer backside.

Thus, what are needed in the art are improved methods of cooling semiconductor devices and structures thereof.

SUMMARY OF THE INVENTION

These and other problems are generally solved or circumvented, and technical advantages are generally achieved, by embodiments of the present invention, which provide novel cooling structures and methods, methods of manufacturing semiconductor devices, and semiconductor devices.

In accordance with one embodiment of the present invention, a cooling structure for a semiconductor device includes at least one channel defined between a first workpiece and a second workpiece. The second workpiece is bonded to the first workpiece. The at least one channel is adapted to retain a fluid.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Embodiments of the present invention provide novel cooling structures and methods for semiconductor devices, wherein cooling channels are defined between two workpieces that are coupled or bonded together. The cooling channels are adapted to retain a fluid such as a liquid or a gas. The workpieces may be bonded together using one of several methods, to be described further herein. The cooling channels provide novel methods of creating micro-channels or micro-tubes for cooling purposes that may be placed in direct contact with active complementary metal oxide semiconductor (CMOS) devices.

The present invention will be described with respect to embodiments in a specific context, namely in the forming of cooling structures for semiconductor devices. The cooling structures may also have useful application in other types of devices that require cooling, for example. Embodiments of the invention may be implemented in many semiconductor applications such as memory devices, logic devices, mixed signal, automotive, and other applications, as examples.

Figure 1:
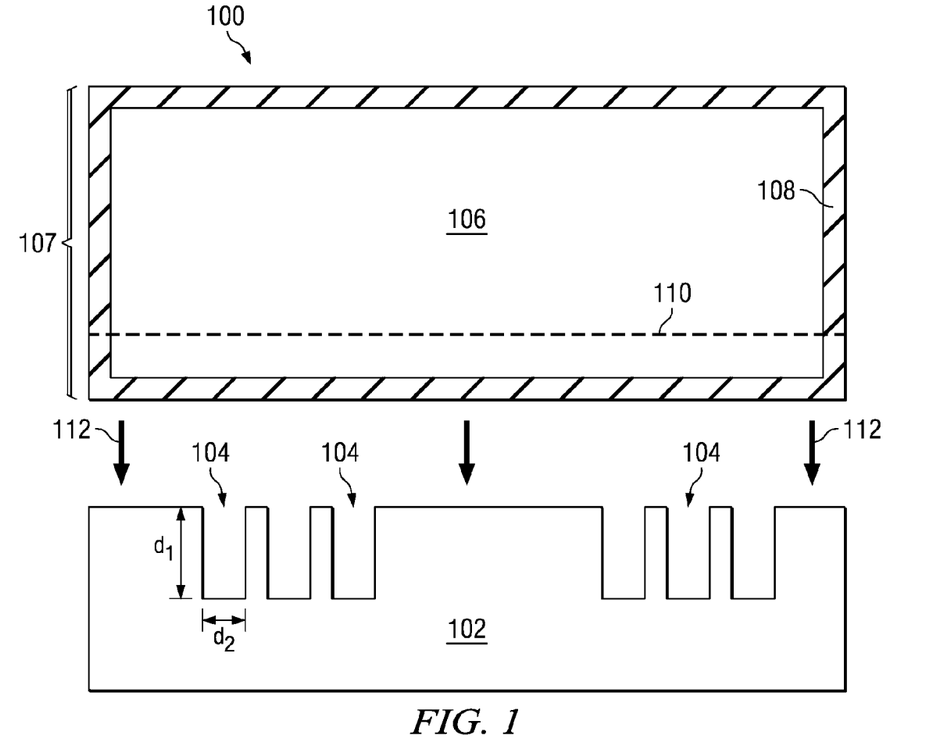
FIG. 1 is a cross-sectional view of two workpieces that will be bonded together with a cooling structure defined between them in accordance with an embodiment of the present invention.

Referring first to FIG. 1, a cross-sectional view is shown of two workpieces that will be bonded together with a cooling structure defined between them in accordance with an embodiment of the present invention. To manufacture the semiconductor device 100, a first workpiece 102 and a second workpiece 106 are provided. The first workpiece 102 and the second workpiece 106 may comprise silicon-on-insulator (SOI) substrates or bulk Si or other semiconductive material substrates, as examples. The workpieces 102 and 106 may include a semiconductor substrate comprising silicon or other semiconductor materials covered by an insulating layer, for example. The substrates may comprise a compound semiconductor such as GaAs, InP, Si/Ge, or SiC, as examples. The substrates may comprise silicon oxide over single-crystal silicon, for example. In the embodiment shown in FIG. 1, the workpieces 102 and 106 comprise bulk Si wafers or substrates.

In some embodiments, the workpieces 102 and/or 106 may include one or more active areas, not shown. The active areas may include, for example, active components or circuits. The workpiece 102 and 106 may include conductive layers or other semiconductor elements, e.g., transistors, diodes, etc. The workpieces 102 and 106 may include one or more conductive material layers comprising conductive lines that are separated by an insulating material, for example.

In other embodiments, the workpiece 102 and 106 may not yet have active components or circuits, and active regions or circuitry may be formed later, after the workpieces 102 and 106 are bonded together, for example.

Next, at least one channel 104 is formed in the first workpiece 102, as shown in FIG. 1. The channel 104 may be formed using lithography or by a direct patterning method, for example. The channel may be formed using a dry or wet etch process, for example. The channel 104 may comprise a spiral or a meandering shape across a surface of the first workpiece 102, to be described further herein. The channel 104 may comprise a continuous groove in the workpiece 102 having a depth or dimension $d_1$ of about 20 to 300 μm and a width or dimension $d_2$ of about 20 to 300 μm, as examples, although alternatively, the channel 104 may comprise other dimensions. The total top surface area of the workpiece 102 comprising the grooves of the channel 104 may comprise about 50% or less of the entire workpiece 102 top surface, for example, to obtain a good adhesive bond between the two workpieces 102 and 106.

The second workpiece 106 may optionally be oxidized to form an oxide 108 on the exterior regions thereof, as shown. The oxide 108 may be formed by heating the second workpiece 106 in an oxygen environment, e.g., by thermal oxide growth. Alternatively, the oxide 108 may be deposited. The oxide 108 may comprise a thickness of about 50 to 100 nm and may comprise silicon dioxide or silicon oxynitride, as examples. A SmartCut™ process by S.O.I. Tec may be used to thin the oxidized second workpiece 107, e.g., at the line marked 110 in FIG. 1. The SmartCut™ interface may be formed due to a H+ implantation process into the workpiece 106, for example. SmartCut™ methods are typically used in SOI wafer manufacturing to create the buried oxide (BOX) insulation layer between the active silicon layer on the top and the bulk silicon at the bottom of the wafer.

The second workpiece 106 may comprise a wafer prepared for SOI wafer manufacturing, or may comprise an extremely thinned bulk wafer that is optionally mounted on a handling wafer, not shown.

Figure 2:
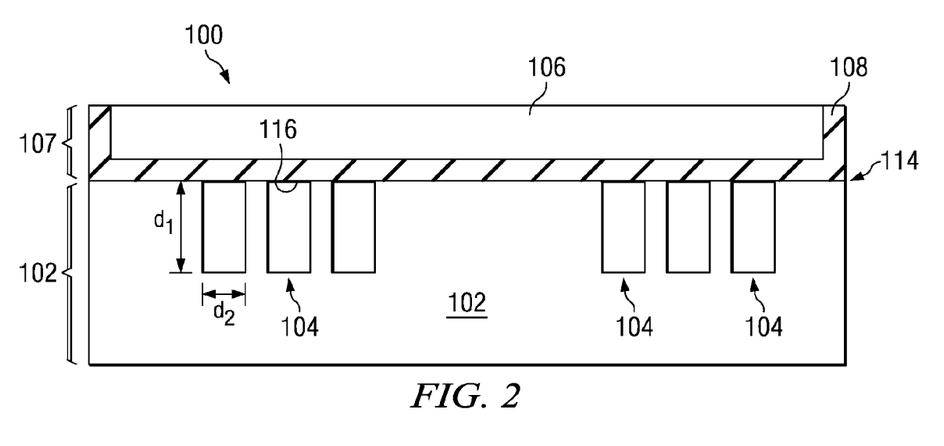
FIG. 2 shows the semiconductor device of FIG. 1 after the two workpieces have been bonded together.

The two workpieces 102 and 106 are then bonded together using a bonding process 112, forming the semiconductor device 100 shown in FIG. 2. The bonding process 112 forms a bond between the workpieces 102 and 106 at their interface 114. One side of the channel 104, e.g., the top side of the channel 104, is defined by one side of the second workpiece 106. Thus, three sides of the channel 104 in the cross-sectional view are defined by the first workpiece 102, and a fourth side of the channel 104 is defined by the second workpiece 106 at 116.

The bonding process 112 may comprise a multiple step procedure, and may include cleaning steps, pressure applying steps, and heating. For example, wet chemical or plasma surface treatments may be used to produce a clean and hydrophilic surface on the workpieces 102 and 106. The bonding surfaces are prepared so that they extremely flat, smooth, and void of particles or other detrimental contaminants. Specific chemical surface cleaning treatments (e.g., with ammonium hydroxide or sulphuric acid) or plasma surface treatments (e.g., with $NH_3$ plasma) may be selected to alter the surfaces to the hydrophilic state, thus, the annealing temperature may be reduced to between about 200 to 300° C. in some embodiments. The workpieces 102 and 106 may then be bonded by bringing the wafers or workpieces 102 and 106 into close proximity and applying a bonding pressure, e.g., at the wafer edges. The bonded workpieces 102 and 106 may then be annealed at a temperature of between about 200 to 1,000° C., depending on the flatness, planarity, and cleanliness of the wafers or workpieces 102 and 106, for example. The anneal process improves the adhesion of the bonded surfaces. In embodiments wherein active devices such as transistors and on-chip wiring levels are not yet formed on the workpiece 106, higher temperatures of about 1,000° C. may be used to obtain a strongly bonded surface, for example.

The bonding process 112 may comprise a $SiO_2$-to-$SiO_2$, Si-to-$SiO_2$, or Si-to-Si wafer bonding or fusion bonding technique in some embodiments, which may be particularly beneficial if the workpieces 102 or 106 comprise SOI substrates, for example. The bonding process 112 may alternatively comprise other bonding techniques, such as anodic bonding or adhesive bonding using spin-on glasses or polymeric materials such as photoresist, polyimide, photoimide, or benzocyclobutane (BCB) as glue. The bonding process 112 may alternatively comprise eutectic bonding (e.g., Cu—Sn) between metal surfaces or metal-to-metal compression bonding (e.g., Cu—Cu compression bonding), as examples.

Figure 6:
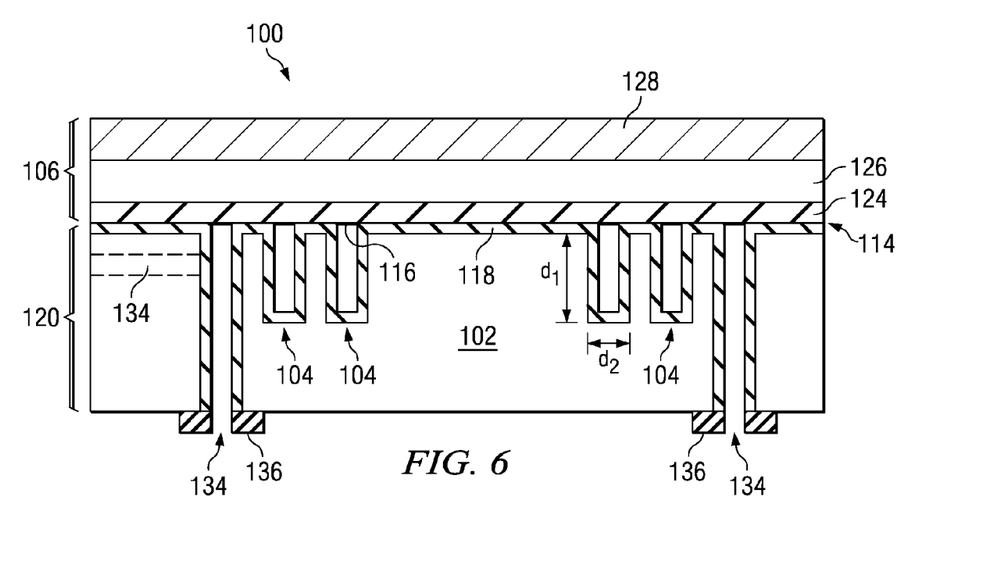

Inlet and outlet ports may be included that are fluidly coupled to the channel 104, not shown in FIG. 2 (see FIG. 6 at 134). The inlet port and outlet port may be considered to be a part of the channel, for example. The inlet port and outlet port may be formed by drilling holes sideways in the workpiece 102 or straight through the workpiece 102 or workpiece 106, for example.

The cooling channel 104 is adapted to retain a fluid, such as a liquid or a gas. After the semiconductor device 100 is completed, a cooling medium (not shown in FIG. 1; see FIG. 13 at 156) may be placed into the channel 104 to cool the semiconductor device 100, using the inlet and outlet ports. The cooling medium 156 or fluid may comprise de-ionized water, air in a gaseous form, liquid air, nitrogen in a gaseous form, liquid nitrogen, argon, helium, or super-critical $CO_2$, as examples, although alternatively, the cooling medium 156 may comprise other liquids, gases, or super-critical fluids. Other liquid coolants or heat transfer fluids such as various types of Freon™ by du Pont, hydrofluorocarbons, or ethanol may also be suitable from a cooling perspective for use as the cooling medium, however, some of these types of fluids may have some environmental or health aspect considerations in some applications, for example. The cooling medium 156 may be circulated through the channel 104 during the operation of the semiconductor device 100, for example.

In the embodiment shown in FIGS. 1 and 2, the first workpiece 102 is coupled to the second workpiece 106 using a semiconductive material. For example, a Si-to-$SiO_2$ bond is formed, because the surface of the second workpiece 106 was oxidized with oxide 108. Alternatively, neither workpiece 102 or 106 may be oxidized, and the bond formed between the workpieces 102 and 106 at 114 may comprise a Si-to-Si bond, for example. In other embodiments, both workpieces 102 and 106 may be oxidized, and the workpieces 102 and 106 may be bonded using a $SiO_2$-to-$SiO_2$ bond, as another example. The workpieces 102 and 106 may alternatively be coupled together by a conductive material, to be described further herein with respect to FIGS. 11 through 16.

Figure 3:
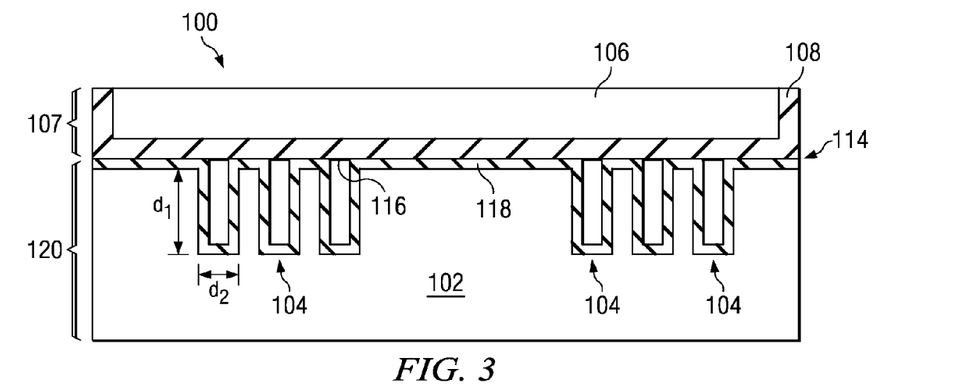
FIG. 3 shows a cross-sectional view of a semiconductor device in accordance with yet another embodiment.

FIG. 3 shows a cross-sectional view of a semiconductor device 100 in accordance with another embodiment of the present invention. The first workpiece 102 may optionally be oxidized after forming the channels 104, as shown. The oxide 118 of the oxidized workpiece 120 may comprise an oxide material and thickness as described for oxide 108, for example. The first workpiece 102 may also be oxidized before forming the channels 104, for example, not shown. The first workpiece 102 may optionally be oxidized both before and after forming the channels 104.

Figure 4:
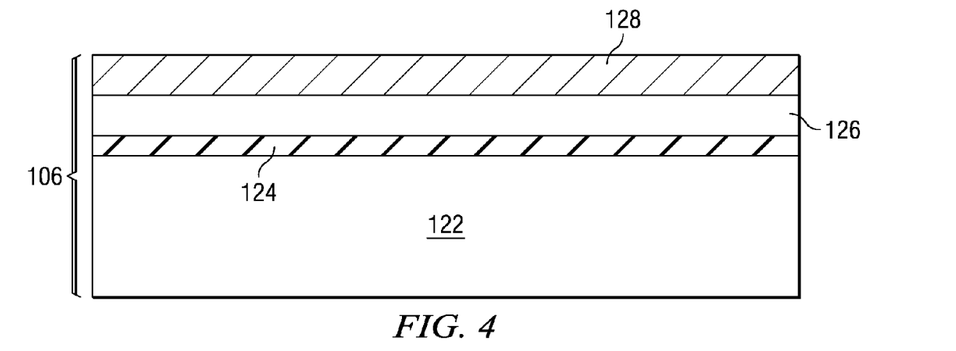
FIGS. 4 through 6 show cross-sectional views of a semiconductor device in accordance with another embodiment at various manufacturing stages.
Figure 5:
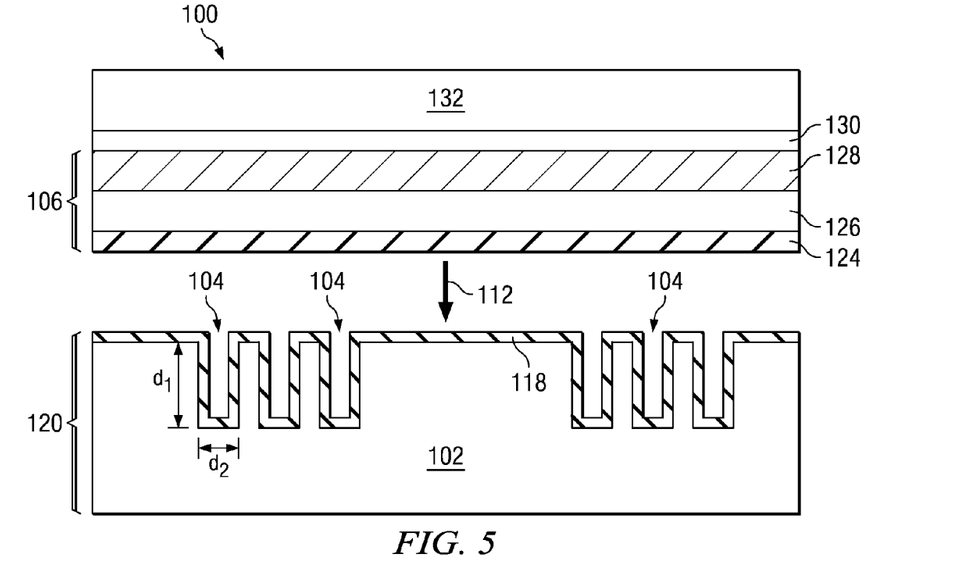

FIGS. 4 through 6 show cross-sectional views of a semiconductor device 100 in accordance with another embodiment at various manufacturing stages. In this embodiment, the second workpiece 106 is first processed to form transistors, other active devices in the active silicon layer 126, and on-chip interconnects 128 for active circuitry, as shown in FIG. 4. The second workpiece 106 may comprise an SOI wafer having a buried oxide layer 124 disposed between bulk Si 122 and the active layer 126 of Si for active devices. Alternatively, the second workpiece 106 may comprise a bulk Si wafer that the active devices are formed in. On-chip interconnect levels 128 are formed over the active layer 126 of Si. The second workpiece 106 is glued to a handling wafer or carrier 132 using a temporary glue 130, as shown in FIG. 5. The glue 130 may comprise an organic spin-on polymer, wax, or other easily removable adhesive, e.g., that is removable at elevated temperatures by melting or by ultraviolet (UV) radiation, for example.

The back side of the second workpiece 106 is ground or etched, down to the buried oxide layer 126 if the workpiece 106 comprises an SOI wafer, or to a predetermined thickness, such as less than about 50 μm, if the workpiece 106 comprises a bulk Si wafer. The first workpiece 102 may optionally be oxidized to form an oxide 118 over the channels 104 and top surface, as shown in FIG. 5. The bonding surfaces of both workpieces 102 and 106 are both cleaned and prepared, and a bonding process 112 is used to bond the first workpiece 102 to the second workpiece 106, as shown in FIG. 5 and as previously described for the embodiments shown in FIGS. 1 through 3. The handling wafer 132 is de-bonded or removed, as shown in FIG. 6, e.g., at a temperature of about 200 to 300 degrees C. or using a UV treatment. A final anneal process is used to activate the bond and optimize bonding strength and adhesion. The temperature of the anneal process in this embodiment may be about 400 to 450 degrees C., for example, or lower. The final anneal process may be performed under a protecting gas atmosphere, e.g., Ar, $N_2$, a forming gas such as $N_2/H_2$, or under a vacuum, for example.

The inlet/outlet ports 134 may include a raised surface 136 proximate or near the exit, as shown. The inlet/outlet ports 134 may be coupled to a coolant reservoir, coolant pump, and off-chip piping, for example, not shown. The inlet/outlet ports 134 may optionally be routed to the side of the semiconductor device 100, as shown in phantom.

Figure 7:
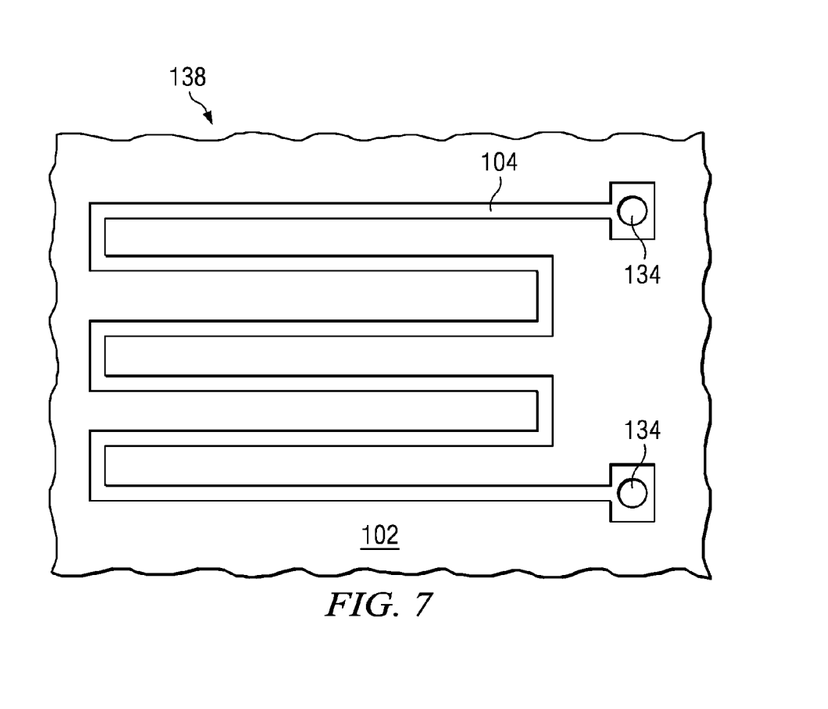
FIG. 7 shows a top view of a cooling channel in accordance with an embodiment.
Figure 8:
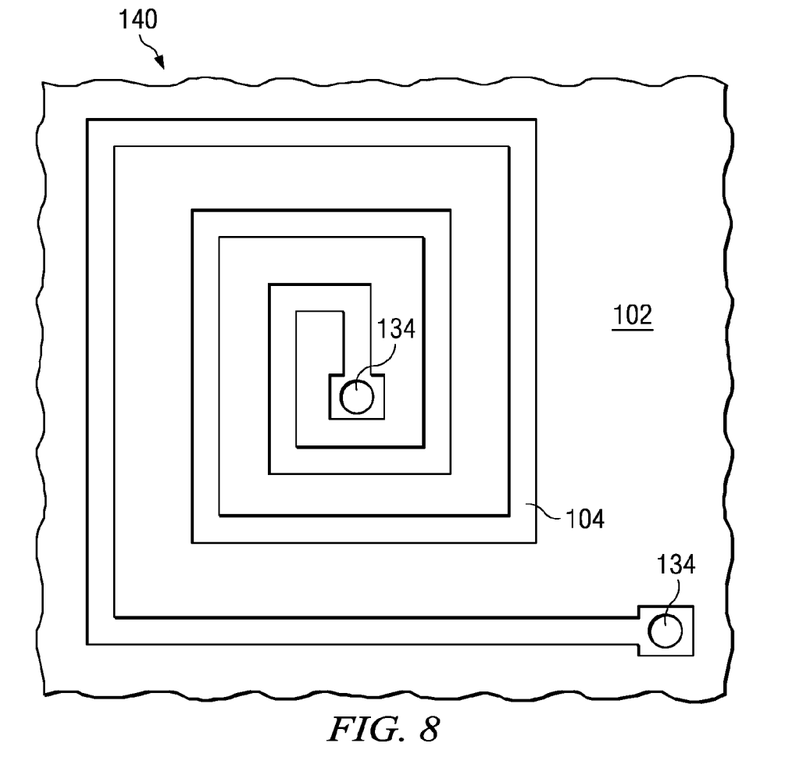
FIG. 8 shows a top view of a cooling channel in accordance with another embodiment.

FIG. 7 shows a top view of a cooling channel 104 in accordance with an embodiment of the present invention. The cooling channel 104 comprises a meandering shape 138 that extends back and forth across a portion of the workpiece 102 for a die or a portion of a die. Alternatively, the cooling channel 104 may comprise a winding or spiral shape 140, as shown in FIG. 8. Alternatively, the cooling channels 104 described herein may comprise other shapes, configurations, and layouts, for example. In particular, channels 104 comprising meanders or spirals with rounded corners or circular spirals may allow an easier flow of the cooling fluid, for example, not shown. The top views of FIGS. 7 and 8 also show the inlet and outlet ports 134 that are coupled to ends of the cooling channels 104.

Figure 9:
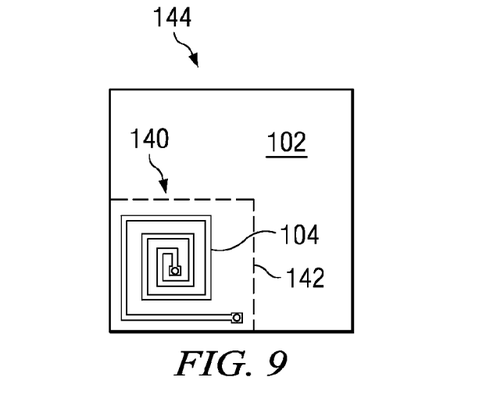
FIG. 9 illustrates a top view of a die having a cooling channel formed in a localized area in accordance with an embodiment of the present invention.
Figure 10:
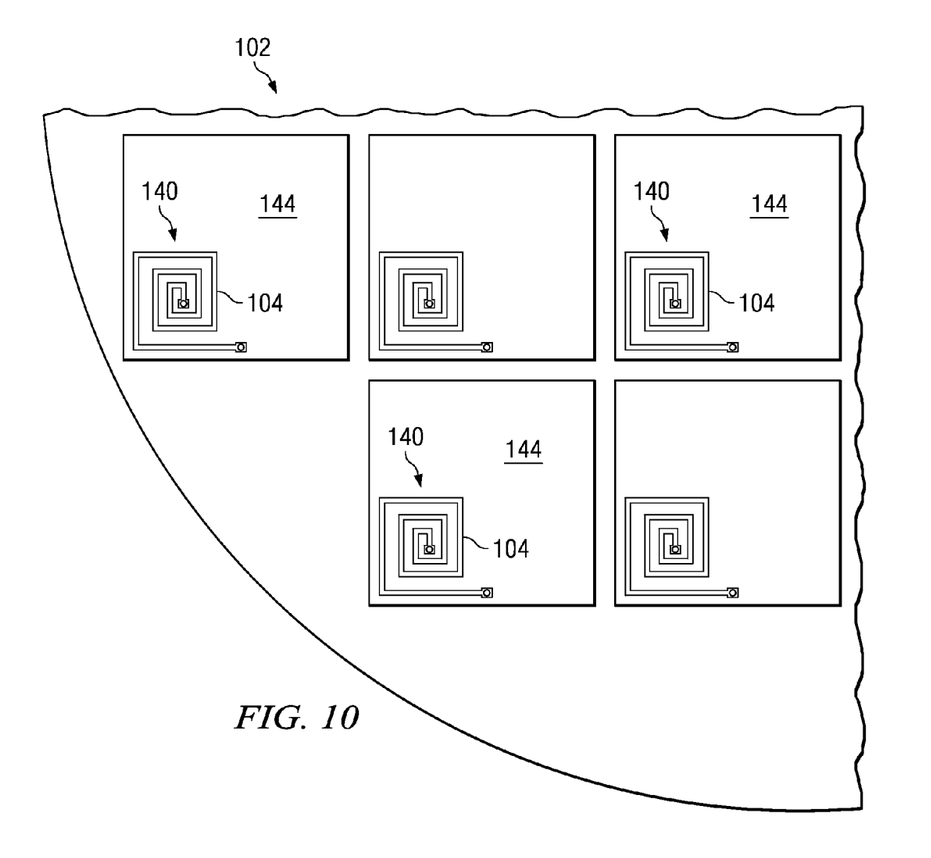
FIG. 10 shows a plurality of die of FIG. 9 formed across a portion of a semiconductor wafer or workpiece.

FIG. 9 illustrates a top view of a die 144 having a cooling channel 104 formed in a localized area in accordance with an embodiment of the present invention. The cooling channels 104 described herein may be formed globally over a single die (not shown), or over localized regions 142 that may comprise high temperature regions, as shown in FIG. 9, for example. Some portions or active areas of an integrated circuit may generate more heat, e.g., in regions where microprocessors and/or other devices reside in some complex system-on-a-chip (SOC) devices and in other applications. Forming the cooling channels 104 locally near or over the heat-generating portions of the integrated circuit rather than globally over a die 144 may be beneficial in some applications, because the bonded area between the first and second workpieces 102 and 106 may be made stronger in areas where the cooling channels 104 are not formed. FIG. 10 shows a plurality of die 144 of FIG. 9 formed across a portion of a semiconductor wafer or first workpiece 102.

FIGS. 11 through 16 illustrate embodiments of the present invention wherein face-to-face (F2F) metal bonding is used to couple together the first workpiece 102 and the second workpiece 106. A face-to-face solid-liquid (SOLID) technique is used to couple together conductive regions of the first workpiece 102 and the second workpiece 106. Metal pads of conductive material on the top surfaces of the first workpiece 102 and the second workpiece 106 are soldered together making the use of a Cu—Sn reaction at about 300 degrees C., forming a $Cu_3Sn$-intermetallic phase. Thus, the first workpiece 102 and the second workpiece 106 are coupled together by a conductive material in these embodiments.

Figure 11:
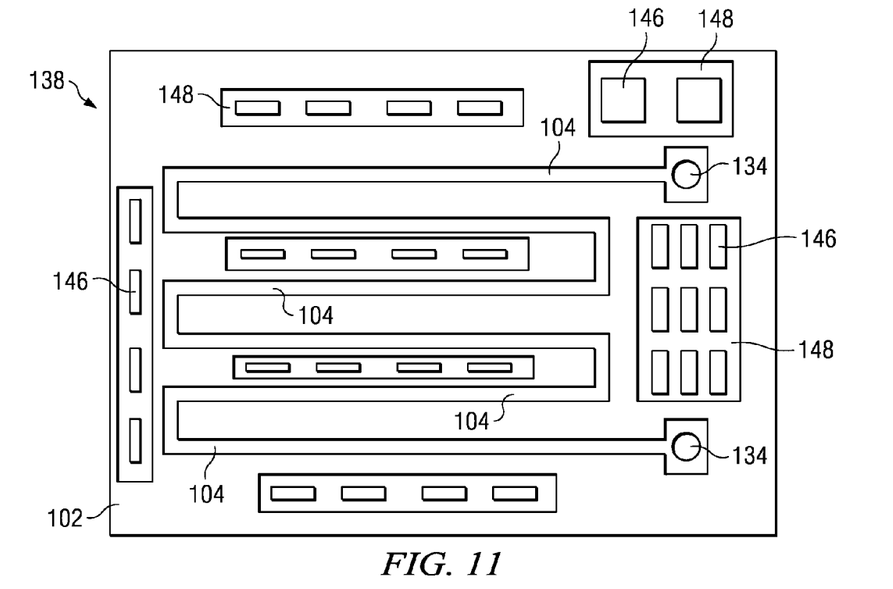
FIG. 11 shows a top view of a semiconductor device in accordance with another embodiment.
Figure 12:
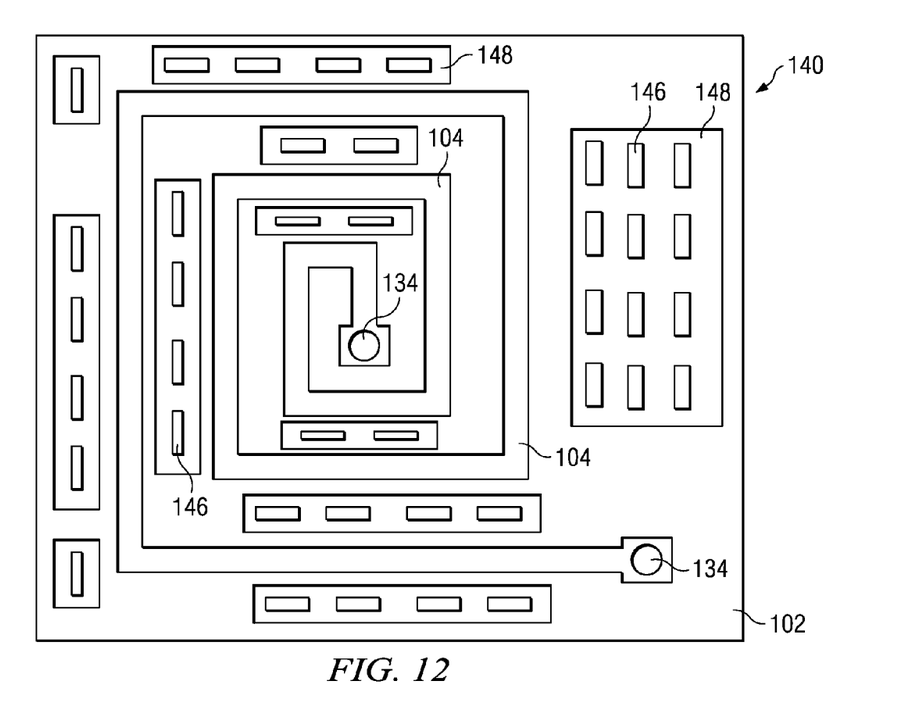
FIG. 12 shows a top view of a semiconductor device in accordance with yet another embodiment.

FIG. 11 shows a top view of a portion of a semiconductor device in accordance with an embodiment of the present invention, wherein the cooling channel 104 comprises a meandering shape 138. FIG. 12 shows a top view of a portion of a semiconductor device in accordance with another embodiment of the present invention, wherein the cooling channel 104 comprises a spiral shape 140. Electrically active connections or pads 146 and gaps 148 are shown in the top views. The cooling channels 104 are enclosed by the soldered areas. Metal areas that are used to define the cooling channels are not used for electrical purposes; rather, they may be unconnected or may be connected to a ground potential.

Figure 13:
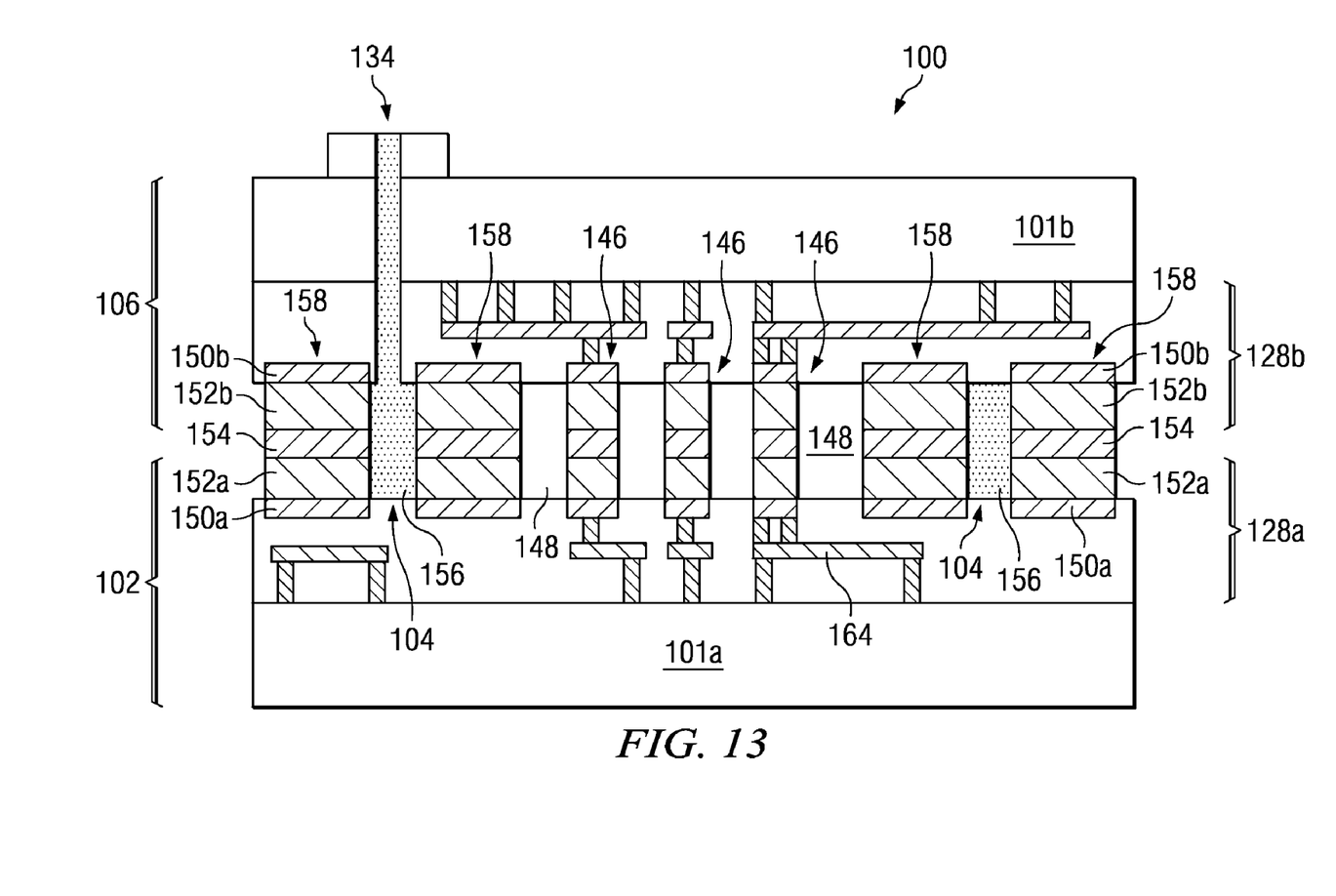
FIG. 13 is a cross-sectional view of a semiconductor device including a cooling structure in accordance with another embodiment.

FIG. 13 is a cross-sectional view of a semiconductor device 100 including a cooling structure 104 in accordance with an embodiment of the present invention. The first workpiece 102 includes interconnect levels 128a, and the second workpiece 106 includes interconnect levels 128b. Interconnect level 128a of the first workpiece 102 comprises a first metal 150a that may comprise a plurality of pads, and a second conductive material 152a comprising copper is formed or plated over the first metal 150a. The first metal 150a may comprise aluminum or copper, for example. Other suitable metals for the first metal 150a may comprise cobalt, tungsten, molybdenum, nickel, palladium, gold, or any suitable combination of different metals, metal alloys or intermetallics, as examples. Between the first metal 150a and the second conductive material 152, an optional metallic barrier may be inserted, not shown. The optional metallic barrier may comprise titanium, titanium nitride, titanium tungsten, tantalum, tantalum nitride, tungsten nitride, cobalt tungsten phosphor, nickel molybdenum phosphor, or any other metallic diffusion barrier types of materials, as examples. The interconnect level 128b of the second workpiece 106 comprises a similar first metal 150b and second metal 152b. The interconnect levels 128a and 128b are coupled together face-to-face using a third metal 154 comprising solder, e.g., a $Cu_3Sn$ phase conductive material. Interconnects 164 are formed in the interconnect levels 128a and 128b of the workpieces 102 and 106 and are adapted to provide electrical connection to active regions or areas 101a and 101b of the workpieces 102 and 106. These active regions or areas 101a and 101b comprise active devices (transistors) and passive devices for the electrical circuitry of the chip.

Some of the metal 150a/152a/154/152b/150a connections labeled 158 define the cooling channels 104 and are electrically inactive or may be coupled to ground. Other connections 146 are electrically active and have gaps 148 which may be filled with air and provide electrical isolation for the electrically active connections 146, for example. The electrically active connections 146 provide electrical connections between the first workpiece 102 and the second workpiece 106. The electrically inactive connections 158 define the cooling channel 104 shape and are adapted to retain the cooling medium 156. An inlet/outlet port 134 can be seen in FIG. 13 that is formed within the second workpiece 106.

Figure 14:
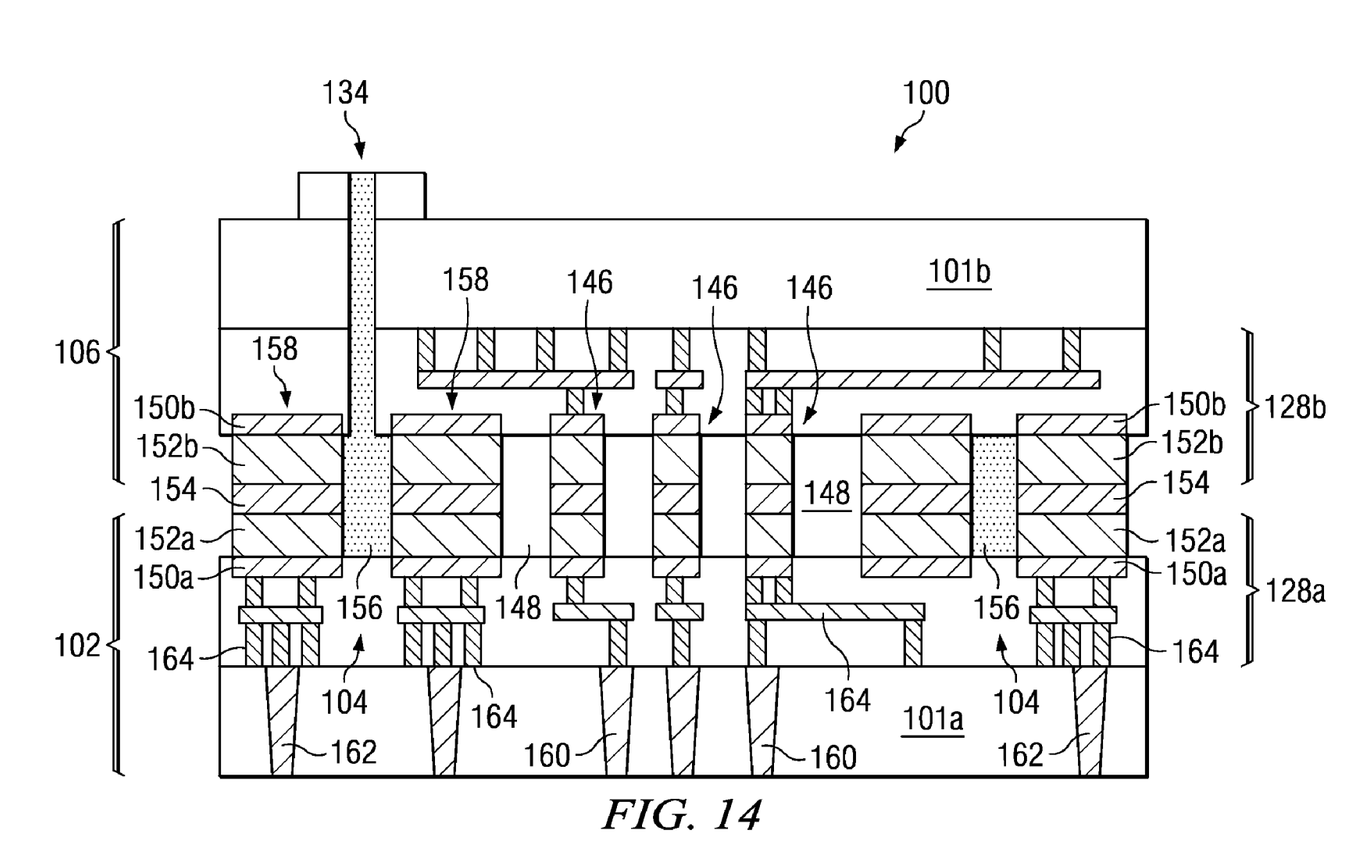
FIG. 14 is a cross-sectional view of a semiconductor device in accordance with another embodiment, wherein through silicon vias are formed on one workpiece.

FIG. 14 is a cross-sectional view of a semiconductor device 100 in accordance with another embodiment of the present invention, wherein through silicon vias (TSVs) 160 and 162 are formed in the first workpiece 102. Some TSVs 160 provide electrical connection to the electrically active interconnects 164. Other TSVs 162 in connection to electrically inactive interconnects 164 provide heat dissipation away from the cooling channels 104. The electrically inactive interconnects are typically connected to the metal areas 158 defining the shape of the cooling channels 156. The TSVs 162 support thermal functions and provide heat flux through the system.

The TSVs 160 and 162 may optionally be connected to a substrate or printed circuit board (PCB) by flip-chip balls or micro-bumps, making use of optional metal pads or redistribution layers. In this case, the electrically active TSVs 160 may be connected to the interconnects of the substrate or PCB, while the electrically inactive TSVs 162 may be connected to heat sinks on the substrate or PCB.

Figure 15:
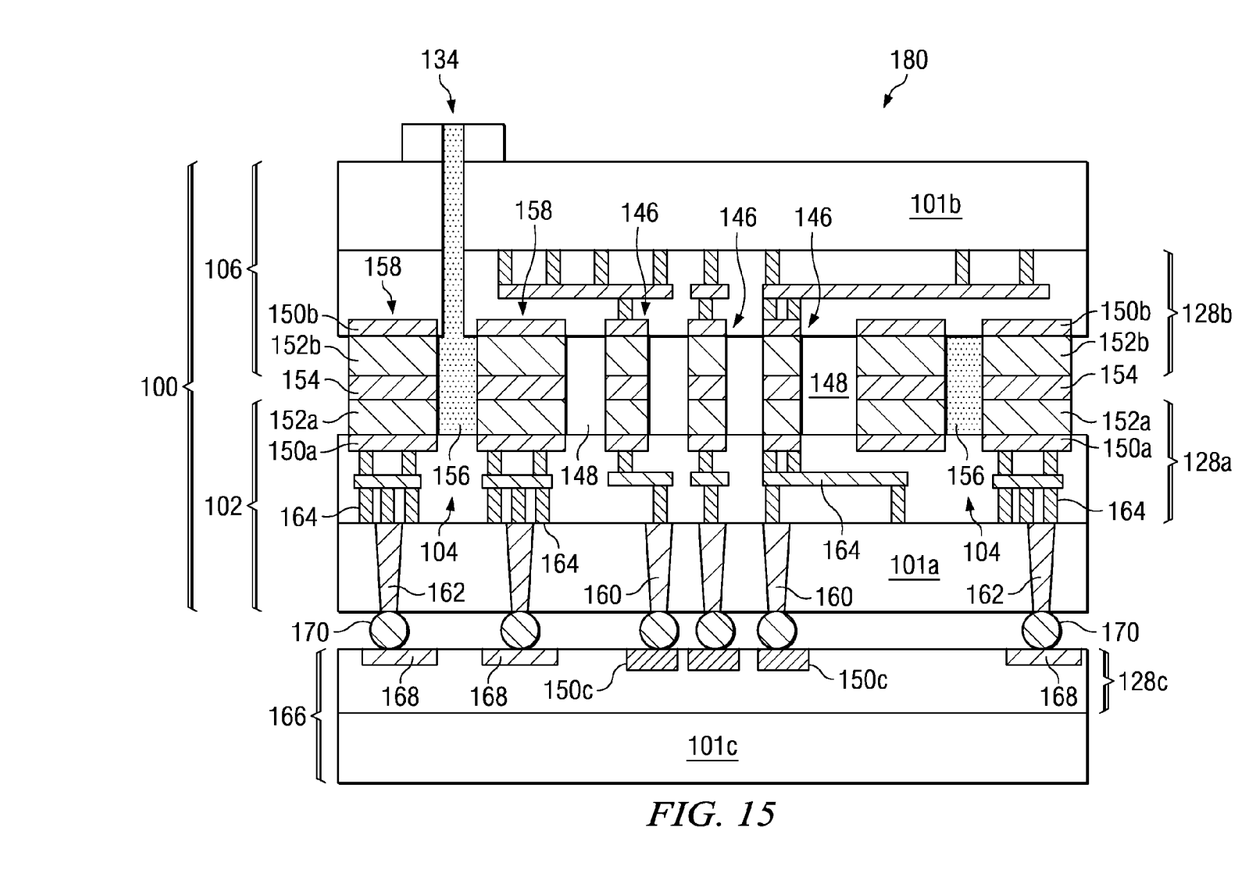
FIG. 15 illustrates an embodiment wherein the through silicon vias are used to connect to a third workpiece.

The TSVs 160 and 162 may optionally be coupled to a third workpiece 166 using solder balls or micro solder bumps 170, as shown in FIG. 15. The electrically active TSVs 160 are coupled to metal layer 150c which may comprise bond pads of the third workpiece 166. The TSVs 162 that provide heat dissipation may be coupled to bond pads 168 that provide thermal connections, for example. Thus, three or more workpieces 102, 106, and 166 may be coupled together in accordance with embodiments of the present invention, forming a multiple die device 180.

The workpieces 102 and 166 may alternatively be bonded together using a copper-pillar technique, a copper-to-copper compression bond technique, or a hybrid combination of copper-copper compression bonding together with a mechanical glue, such as BCB, as examples.

Figure 16:
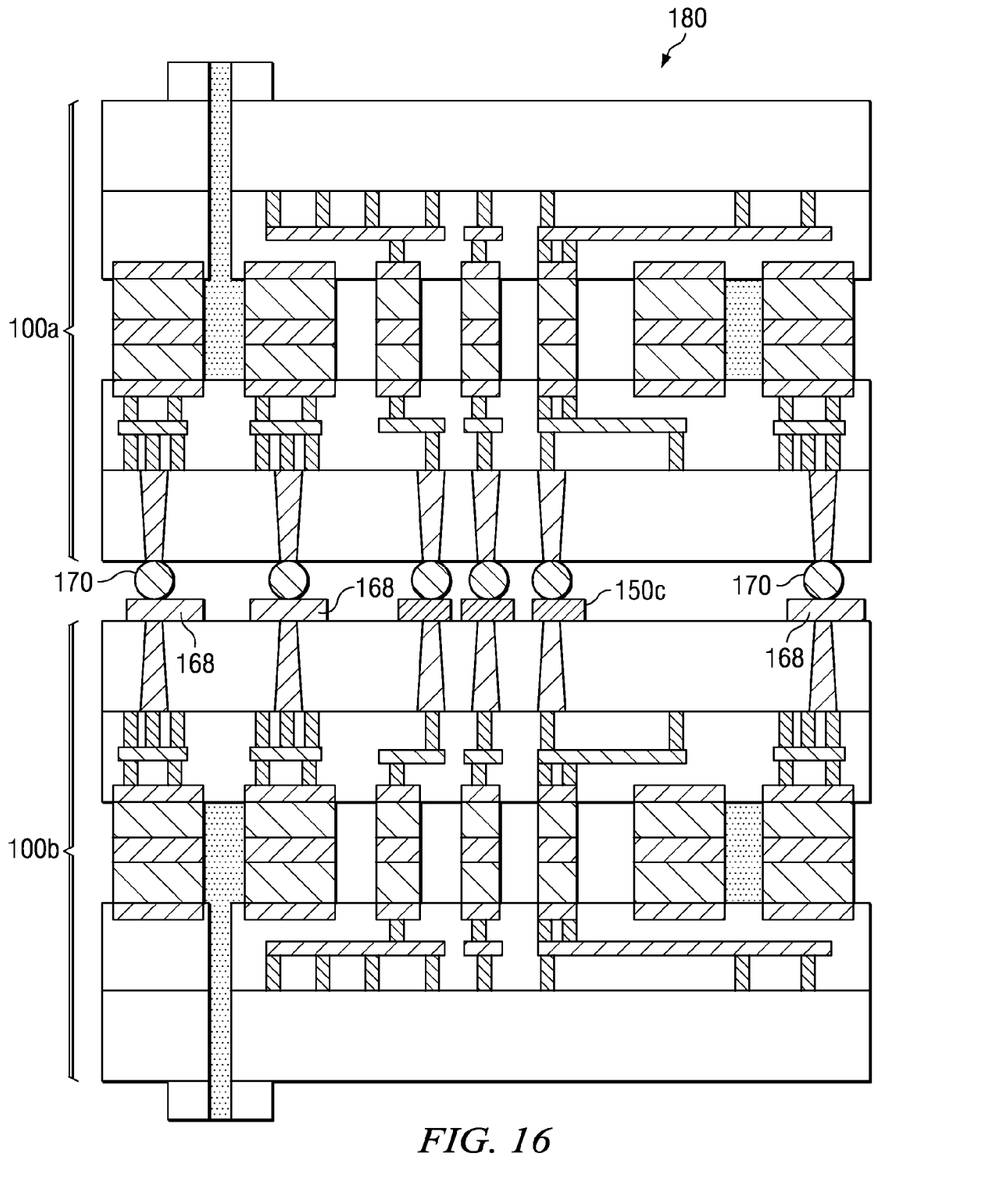
FIG. 16 illustrates an embodiment wherein four workpieces are coupled together.

FIG. 16 illustrates another multiple die device 180 in accordance with another embodiment of the present invention, wherein four workpieces are coupled together. Two semiconductor devices 100a and 100b comprising devices 100 shown in FIG. 14 are coupled together, using solder balls or solder bumps 170 and bond pads 150c and 168 as described with referent to FIG. 17. All references numbers for semiconductor device 100 from FIG. 14 are not included again in FIG. 16: see FIG. 14. The structure comprises four workpieces 102 and 106 coupled together that each have a cooling structure 104 formed between the workpieces 102 and 106.

The top and bottom die are connected to the neighboring middle die using a SOLID F2F (face-to-face) technique, with electrical connections and the cooling channels 104 described herein provided in both connecting layers, e.g., semiconductor devices 100a and 100b. The inlet and outlet ports 134 may be routed to the sides rather than at the top and bottom, allowing the stacking of additional die. Thus, five or more die may be stacked in accordance with embodiments of the present invention, creating a 3D integrated circuit.

The formation of cooling channels 104 according to the described bonding methods herein may be performed in a wafer-to-wafer bonding, in a die-to-wafer bonding or a die-to-die bonding approach, as examples.

Embodiments of the present invention described herein comprise novel cooling structures 104 for semiconductor devices 100 and 180 and novel cooling methods. Embodiments of the present invention also include semiconductor devices 100 and 180 and methods of manufacture thereof.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a first workpiece comprising an active area;
    a second workpiece comprising an active area, a first main surface of the second workpiece being bonded to a first main surface of the first workpiece;
    at least one channel defined between the first workpiece and the second workpiece, the at least one channel being adapted to retain a fluid; and
    at least one inlet port and at least one outlet port coupled to the at least one channel, at least one inlet or outlet port being located at a second main surface of the first workpiece, the second main surface opposite the first main surface.

2. The semiconductor device according to claim 1, wherein the at least one channel is adapted to retain a liquid or a gas.

3. The semiconductor device according to claim 1, wherein the first workpiece is coupled to the second workpiece by an insulating material.

4. The semiconductor device according to claim 1, wherein the first workpiece is coupled to the second workpiece by a conductive material.

5. The semiconductor device according to claim 1, further comprising at least one third workpiece coupled to the first workpiece or the second workpiece.

6. The semiconductor device according to claim 5, wherein the at least one third workpiece comprises active circuitry.

7. The semiconductor device according to claim 1, wherein the at least one inlet port and the at least one outlet port each comprise a raised surface.

8. A cooling structure for a semiconductor device, the cooling structure comprising:
    a channel defined between a first workpiece and a second, a first main surface of the second workpiece being bonded to a first main surface of the first workpiece, wherein the channel extends from a first location at a second main surface of the first workpiece through the first workpiece, along a path between the first workpiece and the second workpiece, and through the first workpiece to a second location at the second main surface of the first workpiece, the second main surface being opposite the first main surface, the channel being adapted to retain a fluid;
    an inlet port connected to the channel at the first location; and
    an outlet port connected to the channel at the second location, wherein the inlet port and the outlet port each comprise a raised surface.

9. The cooling structure according to claim 8, further comprising an inlet port at the first location and an outlet port at the second location, the inlet port and the outlet port being coupled to the channel.

10. A semiconductor device, comprising:
    a first workpiece comprising an active area;
    a second workpiece comprising an active area, the second workpiece being bonded to the first workpiece, wherein the first workpiece is coupled to the second workpiece by a conductive material; and
    at least one channel defined between the first workpiece and the second workpiece, the at least one channel being adapted to retain a fluid, wherein the conductive material defines at least a portion of the at least one channel.

11. The semiconductor device according to claim 10, wherein the conductive material comprises a metal interconnect layer.

12. The semiconductor device according to claim 11, wherein the metal interconnect layer includes a first portion that defines the at least one channel and a second portion that interconnects portions of the active areas of the first and second workpieces, the first portion of the interconnect layer being electrically inactive or coupled to a ground potential.

13. A method of cooling a semiconductor device, the method comprising:
    providing a semiconductor device that comprises a second workpiece coupled to a first workpiece, wherein the first workpiece and the second workpiece each comprise an active area and a channel is formed in the first workpiece, wherein the channel extends along a surface of the first workpiece that is adjacent the second workpiece and through the first workpiece to a surface of the first workpiece opposite the second workpiece;
    placing a fluid in the channel; and
    circulating the fluid through the channel.

14. The method according to claim 13, wherein placing the fluid in the channel comprises placing de-ionized water, air in a gaseous form, liquid air, nitrogen in a gaseous form, liquid nitrogen, argon, helium, super-critical $CO_2$, a hydrofluorocarbon, or ethanol in the channel.

15. The method according to claim 13, wherein the channel is proximate the active area of the first workpiece or proximate the active area of the second workpiece or proximate both the active area of the first workpiece and the active area of the second workpiece.

16. The method according to claim 13, wherein the channel comprises a channel comprising a shape of a spiral or a meandering shape across the surface of the first workpiece adjacent the second workpiece.

17. The method according to claim 13, wherein circulating the fluid through the channel comprises providing the fluid at least one inlet port and removing the fluid from at least one outlet port.

18. A method of manufacturing a semiconductor device, the method comprising:
    providing a first workpiece and a second workpiece;
    forming at least a portion of a cooling channel in the first workpiece, wherein the channel extends from a first location at a second main surface of the first workpiece through the first workpiece, along a path at a first main surface of the first workpiece and through the first workpiece to a second location at the second main surface of the first workpiece, the second main surface being opposite the first main surface; and
    coupling the second workpiece to the first main surface of the first workpiece, wherein coupling the second workpiece to the first workpiece comprises wafer-to-wafer, die-to-wafer or die-to-die bonding.

19. The method according to claim 18, further comprising thinning the second workpiece or the first workpiece, before or after coupling the second workpiece to the first workpiece.

20. The method according to claim 18, further comprising forming active areas on the first workpiece or the second workpiece, before or after coupling the second workpiece to the first workpiece, or before or after forming the cooling channel in the first workpiece.

21. The method according to claim 18, wherein providing the first workpiece or providing the second workpiece comprises providing a bulk substrate.

22. The method according to claim 18, further comprising oxidizing the first workpiece or the second workpiece, before or after forming the cooling channel in the first workpiece.

23. The method according to claim 18, wherein coupling the second workpiece to the first workpiece comprises annealing the first workpiece and the second workpiece at a temperature of about 200 to 1,000° C.

24. The method according to claim 23, further comprising treating the first workpiece or the second workpiece with a wet chemical treatment or plasma surface treatment, before annealing the first workpiece and the second workpiece.

25. The method according to claim 18, wherein coupling the second workpiece to the first workpiece comprises silicon direct bonding, fusion bonding, anodic bonding, adhesive bonding, metal-to-metal compressive bonding, eutectic bonding, or soldering.

26. The method according to claim 18, further comprising forming active areas on the first workpiece or the second workpiece.

27. The method according to claim 18, further comprising forming active areas on the first workpiece and the second workpiece.

28. A semiconductor device, comprising:
a first workpiece having active areas that include high temperature areas that generate more heat than other areas of the first workpiece;
a second workpiece coupled to the first workpiece; and
a cooling channel disposed between the first workpiece and the second workpiece, the cooling channel being disposed locally near the high temperature areas but not the other areas, the cooling channel being adapted to retain a fluid and including at least one inlet port and at least one outlet port.

29. The semiconductor device according to claim 28, wherein the cooling channel comprises a width of about 20 to 300 μm and a depth of about 20 to 300 μm.

30. The semiconductor device according to claim 28, wherein the second workpiece includes active circuitry.

31. A semiconductor device, comprising:
a first workpiece;
a second workpiece coupled to the first workpiece;
a first cooling channel disposed between the first workpiece and the second workpiece, the cooling channel being adapted to retain a fluid and including at least one inlet port and at least one outlet port; and
a third workpiece coupled to the first workpiece or the second workpiece by through silicon vias that extend through the third workpiece.

32. A semiconductor device, comprising:
a first workpiece;
a second workpiece coupled to the first workpiece, wherein the first workpiece or the second workpiece comprise a plurality of through silicon vias;
a cooling channel disposed between the first workpiece and the second workpiece, the cooling channel being adapted to retain a fluid and including at least one inlet port and at least one outlet port; and
a third workpiece coupled to the first workpiece or the second workpiece, wherein the third workpiece is coupled to the first workpiece or the second workpiece by the plurality of through silicon vias.

33. A method of manufacturing a semiconductor device, the method comprising:
providing a first workpiece and a second workpiece, wherein the first workpiece comprises active circuitry;
forming at least a portion of a cooling channel in a first main surface of the first workpiece, the cooling channel extending from the first main surface of the first workpiece to an opposite second main surface of the workpiece; and
coupling the second workpiece to the first main surface of the first workpiece.

34. The method according to claim 33, wherein providing the first workpiece comprises providing a silicon-on-insulator (SOI) substrate.

35. The method according to claim 34, wherein the SOI substrate comprises a buried insulating layer disposed between a bulk semiconductor layer and an active semiconductor layer, wherein active circuitry is disposed in the active semiconductor layer and the cooling channel is formed in the bulk semiconductor layer.

36. The method according to claim 33, wherein the second workpiece comprises active circuitry.

37. The method according to claim 33, wherein the first workpiece includes high temperature areas that generate more heat than other areas of the first workpiece and wherein the cooling channel is disposed locally near the high temperature areas but not the other areas.

38. A semiconductor device, comprising:
a first semiconductor body comprising an active area with transistors formed in the first semiconductor body;
a second semiconductor body comprising an active area with transistors formed in the second semiconductor body, a first main surface of the second semiconductor body being attached to a first main surface of the first semiconductor body;
at least one channel defined in the first semiconductor body between the first semiconductor body and the second semiconductor body, the at least one channel being adapted to retain a fluid;
an inlet port located at a second main surface of the first semiconductor body and connected to a first end of the channel, the second main surface opposite the first main surface; and
an outlet port located at the second main surface of the first semiconductor body and connected to a second end of the channel.

39. The semiconductor device according to claim 38, wherein the first semiconductor body is coupled to the second semiconductor body by an insulating material.

40. The semiconductor device according to claim 38, wherein the first semiconductor body is coupled to the second semiconductor body by a semiconductive material.

41. The semiconductor device according to claim 38, wherein the first semiconductor body is coupled to the second semiconductor body by a conductive material.

42. The semiconductor device according to claim 41, wherein the conductive material defines at least a portion of the at least one channel.

43. The semiconductor device according to claim 38, wherein the at least one channel is adapted to circulate the fluid.

\* \* \* \* \*